(12) United States Patent
Harada et al.

(10) Patent No.: US 6,574,781 B1
(45) Date of Patent: Jun. 3, 2003

(54) DESIGN METHODOLOGY FOR INSERTING RAM CLOCK DELAYS

(75) Inventors: Reiko Harada, Miyazaki (JP); Kazuaki Gotoh, Miyazaki (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 191 days.

(21) Appl. No.: 09/642,101

(22) Filed: Aug. 21, 2000

(51) Int. Cl.7 .............................................. G06F 17/50
(52) U.S. Cl. ......................................................... 716/5
(58) Field of Search ............................... 716/1, 2, 4, 6, 716/7, 10, 5, 12, 17; 327/395

(56) References Cited

U.S. PATENT DOCUMENTS

| | | | | |
|---|---|---|---|---|
| 5,339,253 A | * | 8/1994 | Carrig et al. ................... | 716/6 |
| 5,648,911 A | * | 7/1997 | Grodstein et al. ............. | 716/18 |
| 5,740,067 A | * | 4/1998 | Hathaway ....................... | 716/6 |
| 6,046,984 A | * | 4/2000 | Grodstein et al. ............. | 716/10 |
| 6,049,241 A | * | 4/2000 | Brown et al. ................. | 327/295 |
| 6,205,572 B1 | * | 3/2001 | Dupenloup ..................... | 716/2 |
| 6,333,656 B1 | * | 12/2001 | Schober ....................... | 327/202 |
| 6,367,060 B1 | * | 4/2002 | Cheng et al. ................. | 716/10 |

FOREIGN PATENT DOCUMENTS

| | | |
|---|---|---|
| JP | 2000-90142 | 3/2000 |

OTHER PUBLICATIONS

"Generating Clock Trees," Silicon Ensemble Training Manual, Version 5.1, Sep. 1998 (Japanese edition), pp. 6–1 to 6–38.

"Envisia product family; design planning; implementation, and assembly," Innotech Corporation, Jul. 1999.

C.M. Chu, "Clock Tree Synthesis Methodology," International Cadence Users Group Conference, Oct. 1995.

* cited by examiner

*Primary Examiner*—Matthew Smith
*Assistant Examiner*—Thuan Do

(57) ABSTRACT

An integrated circuit including a random-access memory (RAM) macrocell is designed by the use of computer-aided tools that automatically generate a clock tree with minimal clock skew. The clock tree is then modified to delay the clock signal supplied to the RAM macrocell, to enable RAM set-up timing requirements to be satisfied. One preferred method modifies the clock tree by regenerating the clock tree, with a clock distribution cell on the RAM clock path redefined as a leaf cell. Another preferred method reduces the sizes of transistors in one or more clock distribution cells on the RAM clock path. These methods can usually provide an adequate RAM set-up timing margin while still permitting the entire clock tree to be generated automatically by the computer-aided tools.

12 Claims, 13 Drawing Sheets

DESIGN METHODOLOGY FOR INSERTING RAM CLOCK DELAYS

BACKGROUND OF THE INVENTION

The present invention relates to a method of designing a semiconductor integrated circuit, this method constituting one part of the general field of semiconductor integrated circuit fabrication technology.

Large-scale integrated circuits are now designed through the use of computer-aided design (CAD) tools, also referred to as electronic design automation (EDA) tools. In the past, such tools were based on the input of schematic circuit diagrams, but recent tools synthesize the circuit design from an abstract description of the desired circuit functions, entered not in diagrammatic form but in a hardware description language (HDL). These tools also generate a clock tree that supplies clock signals to the parts of the integrated circuit that require clock input. In generating the clock tree, the tools automatically balance the clock tree and minimize clock skew, so that the clock signals supplied to different parts of the integrated circuit are mutually synchronized.

Among the parts of a large-scale integrated circuit there may be one or more embedded random-access memory (RAM) modules, also referred to as RAM macrocells. In the past, RAM was asynchronous, not requiring input of a clock signal, and not constrained by clock timing. As circuit speeds have increased and circuit dimensions have decreased, however, asynchronous RAM has given way to synchronous RAM, which operates in synchronization with a clock signal supplied through the clock tree. The use of synchronous RAM greatly simplifies the timing design of RAM control signals, but raises a new problem, in that at high clock speeds, RAM set-up timing requirements become difficult to satisfy.

In a typical read access to an embedded synchronous RAM macrocell, for example, output of an address signal to the RAM macrocell begins at a falling transition of the clock signal, and the address signal is latched at the next rising transition of the clock signal. This leaves at most only one-half of one clock cycle of address set-up time. To aggravate the problem, the processing unit that generates the address signal may be located at some distance from the RAM macrocell, causing the address signal to be delayed in propagation, so the address set-up time may be considerably less than one-half clock cycle. Depending on the propagation delay, the RAM address set-up time may be inadequate.

If the integrated circuit were designed by input of schematic diagrams, RAM set-up timing problems could be dealt with by manual insertion of delay elements in the RAM clock line. With tools that generate the clock tree automatically, however, such timing problems are not easily solved, because the tools automatically ensure that the clock tree supplies substantially synchronized clock signals to processing units and RAM macrocells alike.

Further explanation of the RAM set-up timing problem will be given in the detailed description of the invention.

SUMMARY OF THE INVENTION

An object of the present invention is to provide an adequate set-up time for a RAM macrocell embedded in an integrated circuit designed by tools that automatically generate a clock tree with minimal clock skew.

The invented method of designing a semiconductor integrated circuit including a RAM macrocell uses computer-aided design tools that automatically generate a clock tree. The clock tree includes a clock path having a root cell at which a clock signal is generated, a leaf cell disposed in the RAM macrocell, and one or more buffers disposed between the root cell and the leaf cell. After the clock tree is generated, the computer-aided design tools are used to modify the clock tree so as to increase the clock propagation delay on the clock path from the root cell to the RAM macrocell.

In one aspect of the invention, the clock tree is modified by designating one of the buffers on the clock path from the root cell to the RAM macrocell as a leaf cell, in place of the leaf cell in the RAM macrocell, and then using the computer-aided design tools to regenerate the clock tree.

In another aspect of the invention, the clock tree is modified by down-sizing a buffer on the clock path from the root cell to the RAM macrocell; that is, by reducing the dimensions of transistors in the buffer, using the computer-aided design tools, thereby reducing the current-driving capability of the buffer.

By delaying the clock signal supplied to the RAM macrocell, the invented method can usually provide an adequate set-up time for the RAM macrocell, while still permitting the clock tree to;be generated entirely by use of the computer-aided design tools.

DETAILED DESCRIPTION OF THE INVENTION

Two embodiments of the invention will be described with reference to the attached drawings, following a further description of RAM set-up timing.

Figure 1:
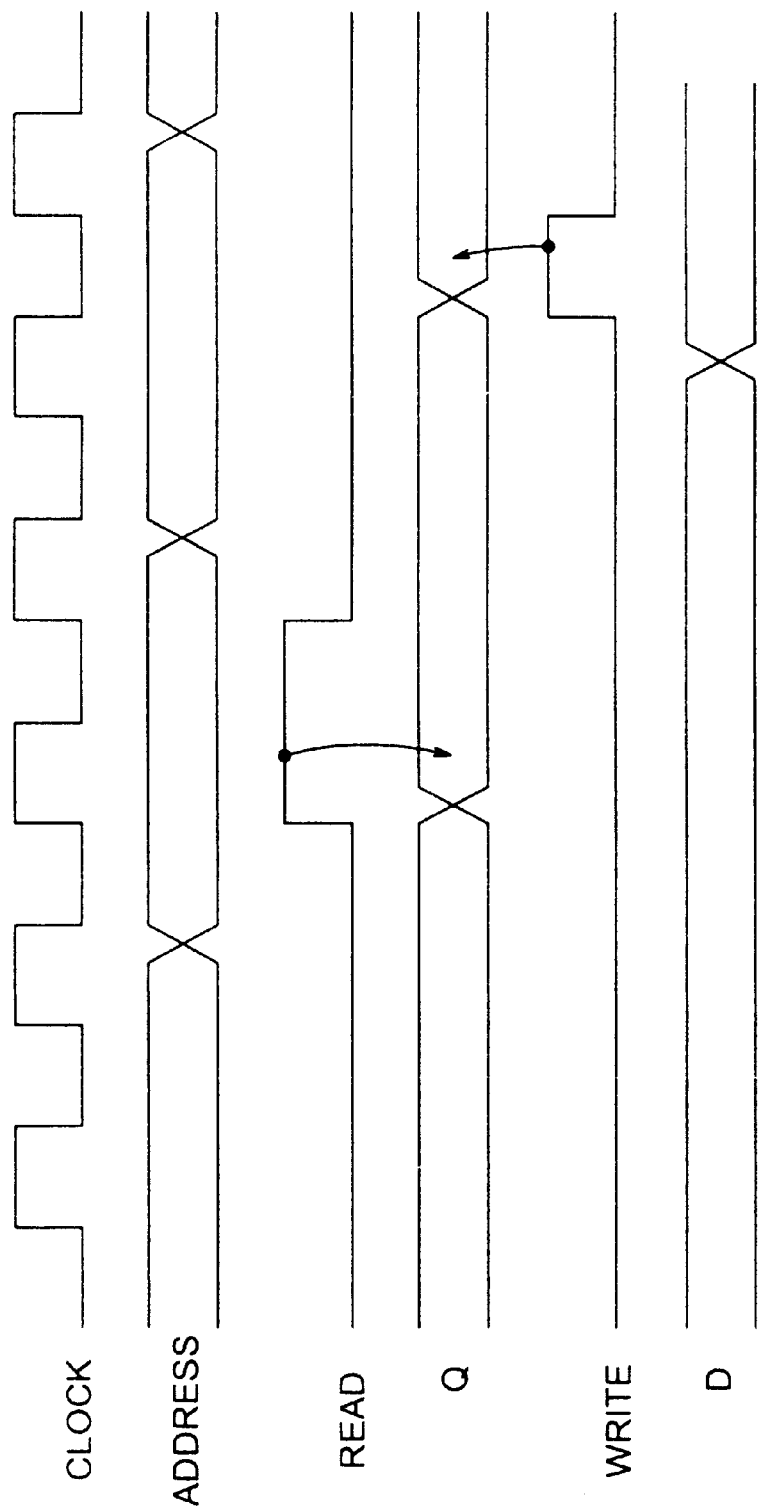
FIG. 1 is a timing diagram illustrating read and write access to an asynchronous RAM.

As an example of the prior art, FIG. 1 illustrates the read and write access timing of an asynchronous RAM by showing the timing of a clock signal, address signal, read and write control signals, and data signals (D and Q). The clock signal is supplied to a central processing unit (CPU) or other processing unit that generates the address signal and read and write control signals. In read access, when the read control signal is activated, the RAM begins output of stored data (Q) from the indicated address. In write access, the processing unit supplies an address and data (D), and the data are stored (Q) at the specified address in the RAM in synchronization with the write control signal. With this arrangement, the timing and duration of the read and write control signals can be adjusted freely to provide an adequate address set-up time.

Figure 2:
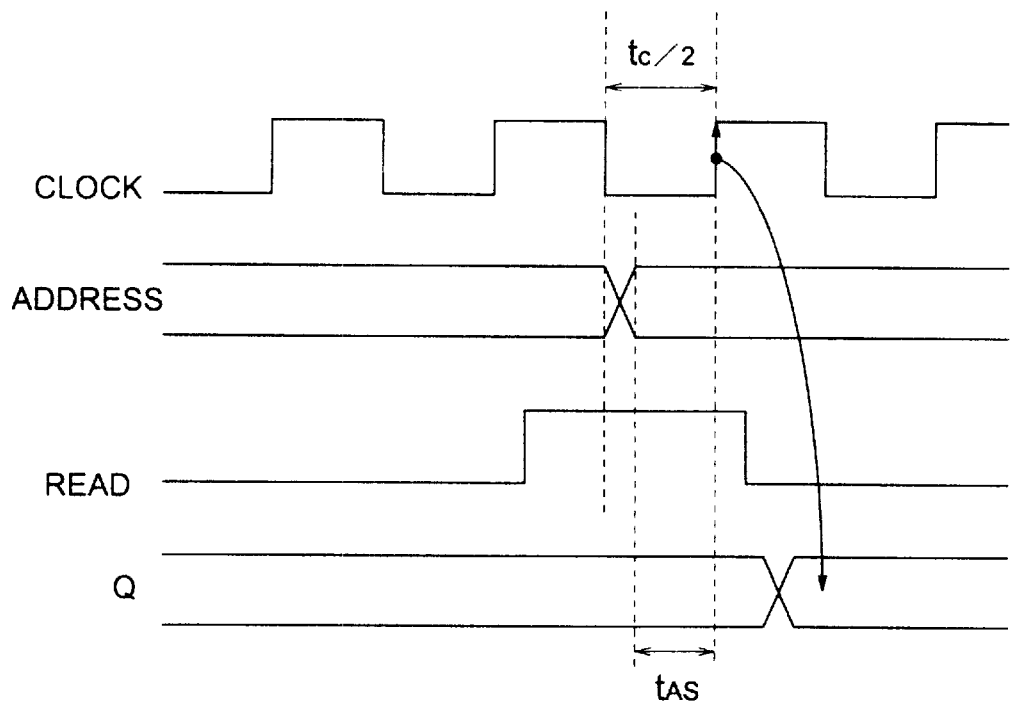
FIG. 2 is a timing diagram illustrating read access to a synchronous RAM.

FIG. 2 illustrates the read access timing of a synchronous RAM. The address signal is received transparently when the clock signal is low, and is latched when the clock signal is high. Output of stored data (Q) is triggered by the rising edge of the clock signal when the read control signal is active. Accordingly, the address set-up time $t_{AS}$, as measured from the time when the address signal becomes valid, amounts to less than one-half of one clock cycle ($t_c/2$), and cannot be adjusted by altering the timing or duration of the read control signal. Similar considerations apply in write access.

Figure 3:
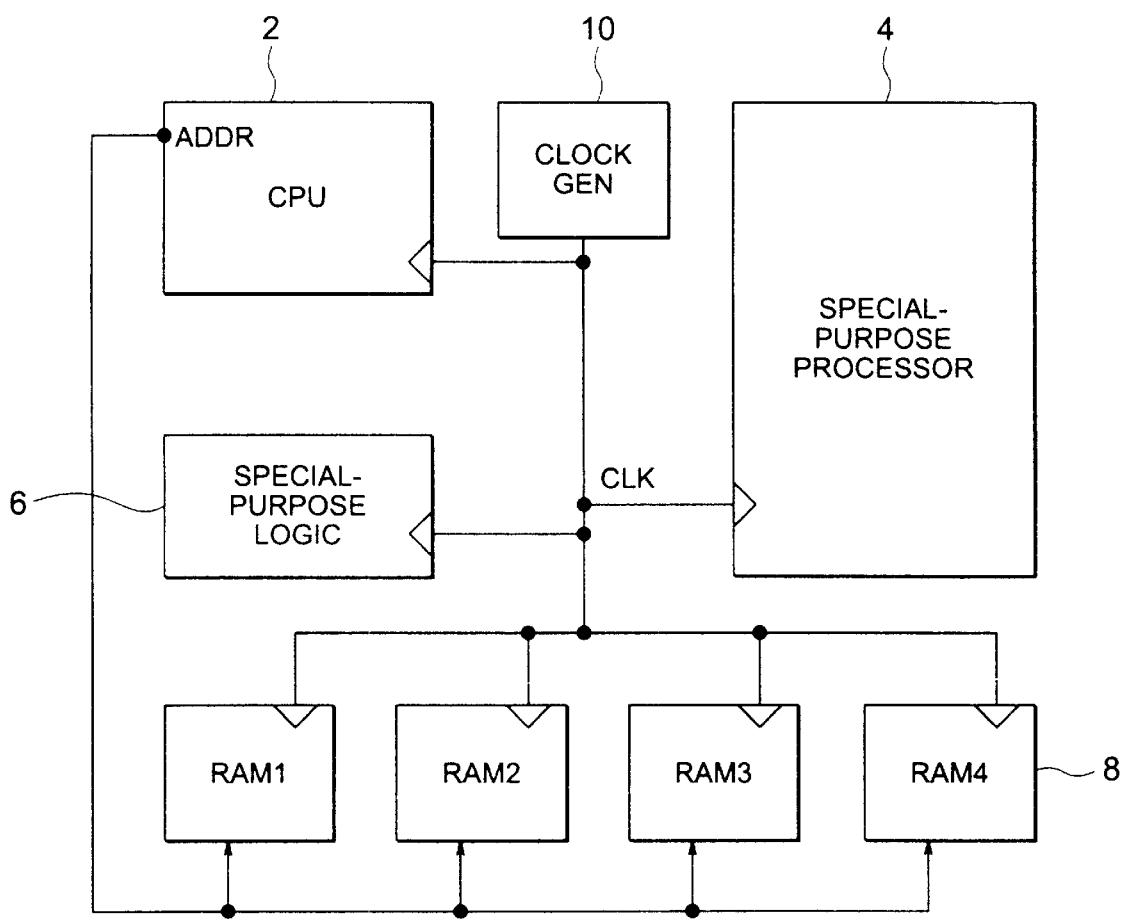
FIG. 3 is a block diagram illustrating an integrated circuit with embedded RAM macrocells.

As an example of an integrated circuit with embedded RAM, FIG. 3 very schematically illustrates the layout of an integrated circuit having a central processing unit (CPU) 2 as a core, another special-purpose processing unit 4, special-purpose logic circuits 6, and RAM facilities comprising several synchronous RAM macrocells 8, designated RAM1 to RAM4. A clock generator (CLOCK GEN) 10 supplies a clock signal (CLK) to the CPU core 2, special-purpose processing unit 4, special-purpose logic circuits 6, and RAM macrocells 8, which operate with substantially identical clock timing. The CPU core 2 sends address (ADDR) signals to the RAM macrocells 8, but due to the distance of the RAM macrocells 8 from the CPU core 2 in the layout of the integrated circuit, and the consequent propagation delay on the address signal line, the address signals arrive late at the RAM macrocells, reducing the address set-up time $t_{AS}$ to much less than half a clock cycle. If the address propagation delay cannot be shortened, then the RAM clock signals need to be delayed or skewed to compensate.

Figure 4:
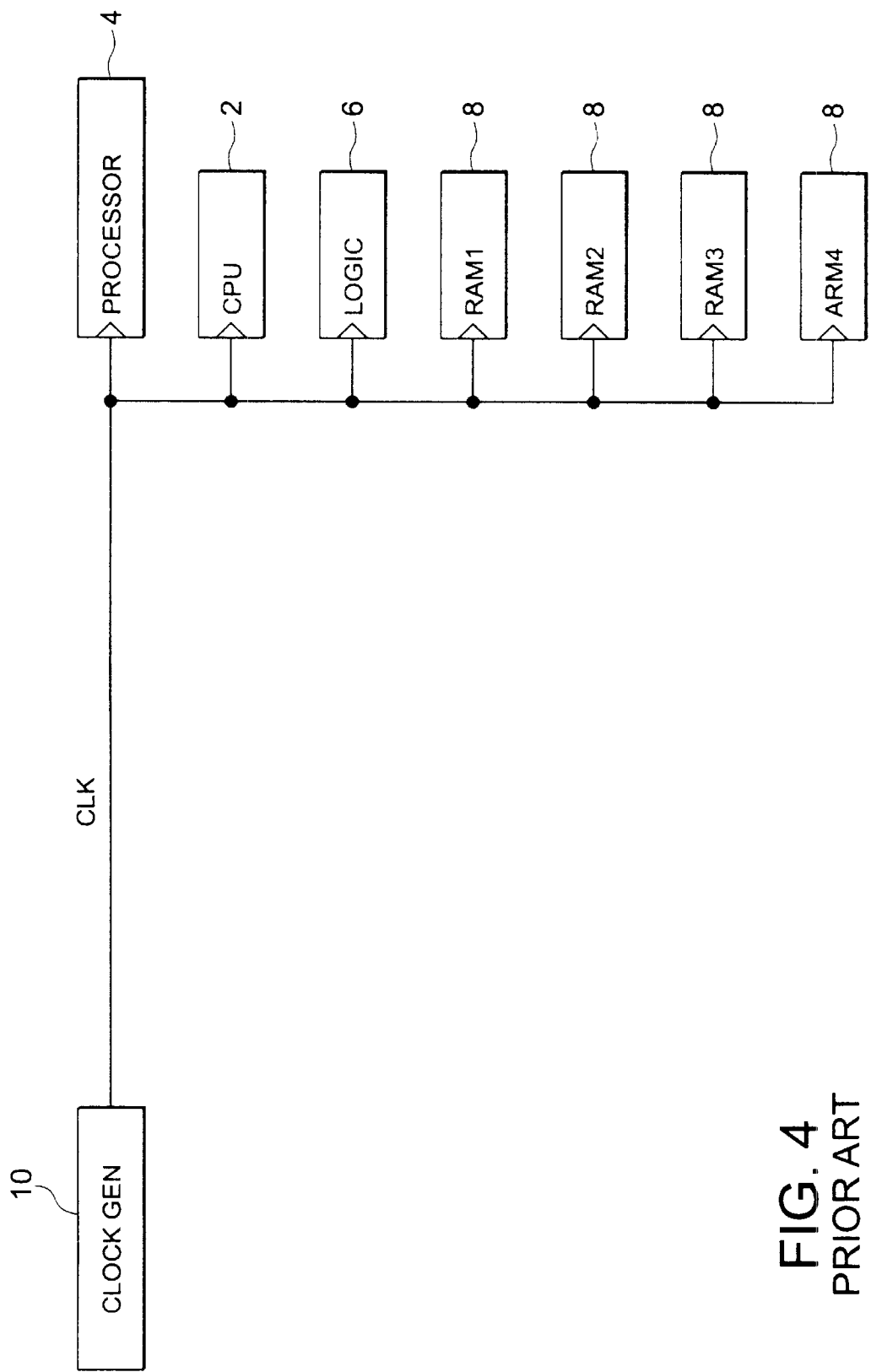
FIG. 4 is a block diagram illustrating a first stage in automatic clock tree generation by conventional methods.
Figure 5:
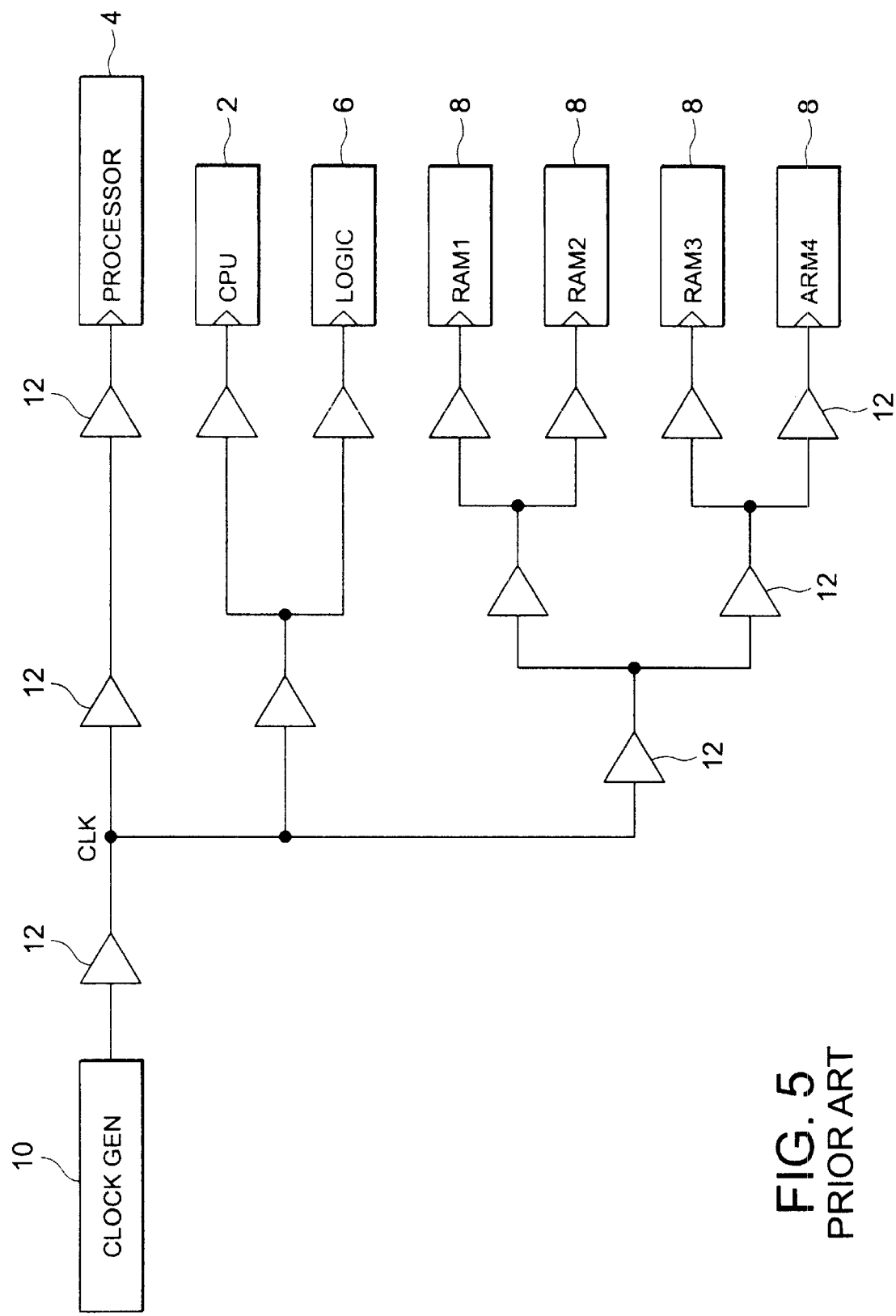
FIG. 5 is a block diagram illustrating a last stage in automatic clock tree generation by conventional methods.

The generation of a conventional clock tree by timing-driven computer-assisted design (CAD) tools is illustrated in FIGS. 4 and 5. To begin synthesis of the clock tree, the original clock signal (CLK) is routed directly from the clock generator 10 to the RAM macrocells 8 and other functional blocks 2, 4, 6 as shown in FIG. 4. If different RAM macrocells 8 are at different distances from the clock generator 10, they receive their clock signals at different times. During clock-tree synthesis, clock distribution cells or buffers 12 are added as shown in FIG. 5 to enable all of the RAM macrocells 8 and other functional blocks 2, 4, 6 to receive their clock signals at substantially the same time. The buffers 12 may be buffer amplifiers, as shown, or inverters.

The RAM macrocells 8 in FIGS. 4 and 5 are referred to as leaf cells because they are disposed at the terminal ends of the clock tree. More precisely, the leaf cells of the clock tree are circuit elements such as flip-flops or latches (not visible), driven by the clock signal, that are disposed in the RAM macrocells 8 and other functional blocks 2, 4, 6. The clock generator 10, or a buffer (not visible) disposed therein, is referred to as the clock root cell. Conventional clock tree synthesis is a process of inserting distribution cells 12 between the root cell and leaf cells to construct a tree that is balanced with respect to wiring load, and that equalizes the total delay on the clock path from the root cell to each leaf cell. The total delay on each clock path is the sum of the original clock delay within the clock generator 10, the propagation delay in the clock distribution cells 12, and the wiring propagation delay.

Figure 6:
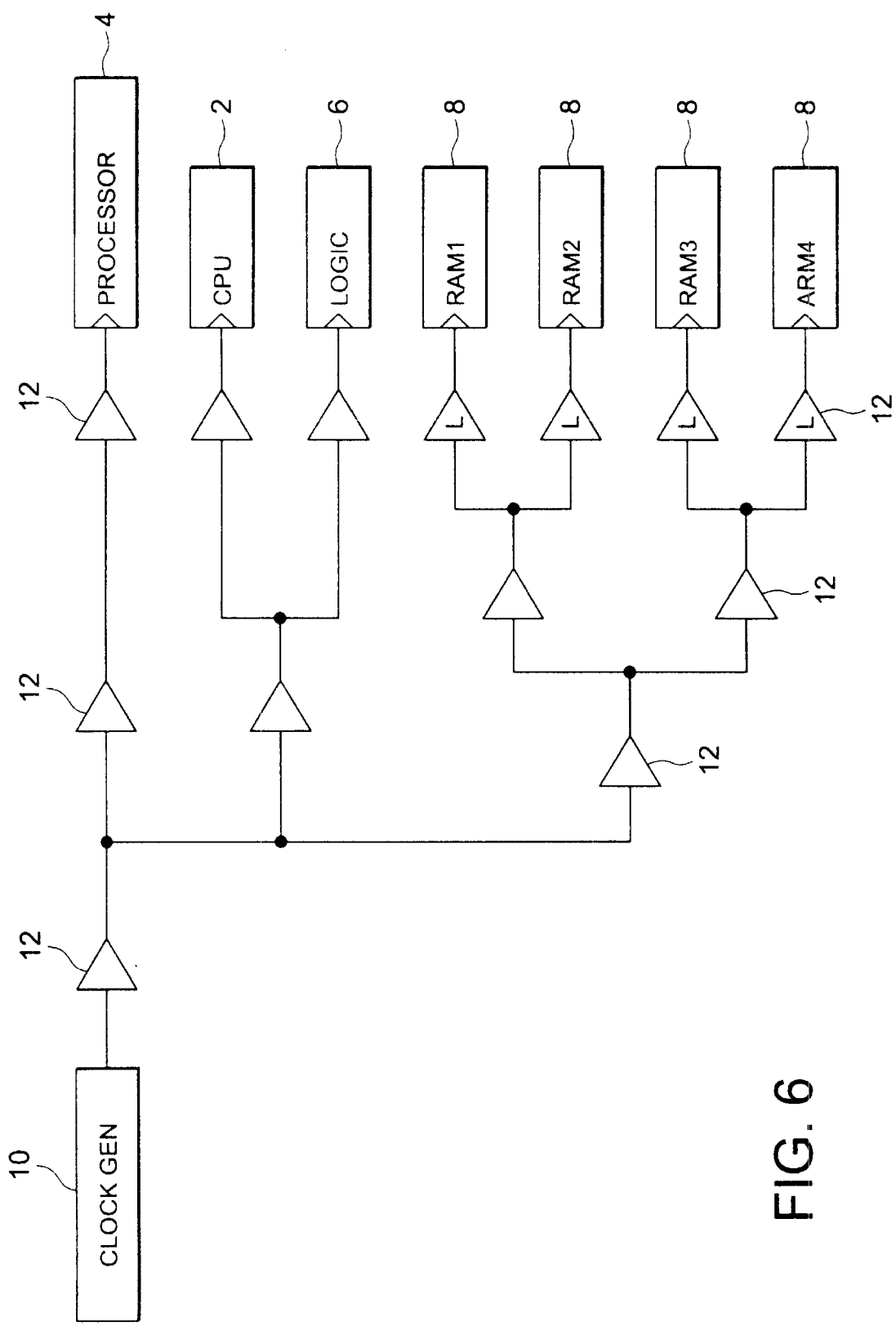
FIGS. 6, 7, and 8 are block diagrams illustrating further steps in automatic clock tree generation according to the first aspect of the invention.

The first embodiment of the invention takes advantage of the capability of CAD tools to alter the leaf-cell designations. After a clock tree such as the one in FIG. 5 has been generated, the clock tree is regenerated, with the buffers 12 nearest the RAM macrocells 8 now designated as leaf cells, as indicated by the letter L in FIG. 6. The CAD tools alter the clock tree by, for example, altering the size of transistors in the clock distribution cells 12, or adding further clock distribution cells 12, so as to align the clock signal timing at the newly designated leaf cells marked L with the clock signal timing at other leaf cells in the integrated circuit. Consequently, the clock signals supplied from the newly designated leaf cells (marked L) to the RAM macrocells 8 are delayed with respect to the clock timing at, for example, the CPU core 2.

Figure 7:
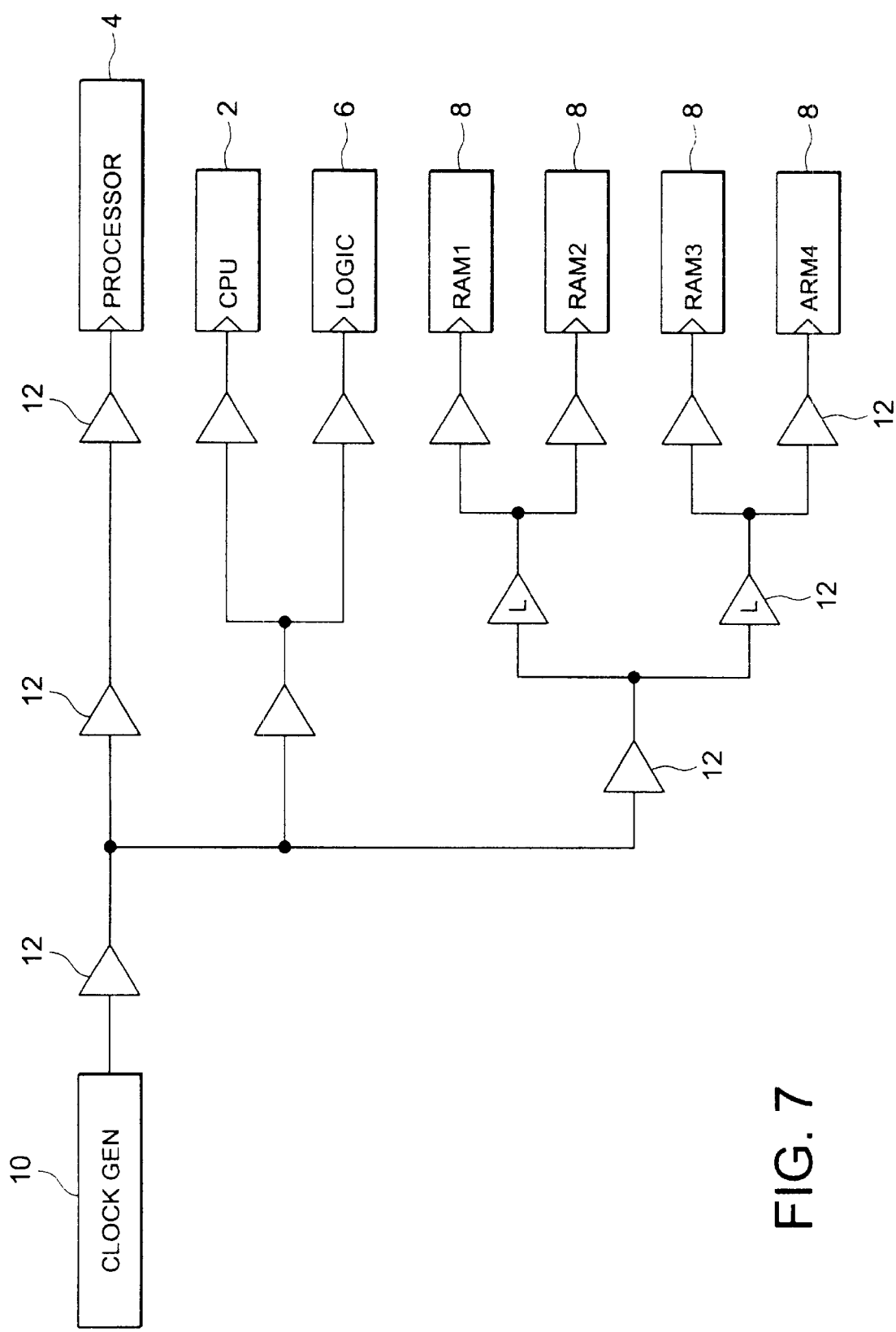

A timing analysis is now performed to determine whether the RAM set-up timing requirements are satisfied. If these requirements are not satisfied, the leaf-cell designations on the clock paths leading to the RAM macrocells 8 are moved one cell further back from the RAM macrocells 8, as indicated by the letter L in FIG. 7, and the process of clock tree regeneration and timing analysis is repeated.

Figure 8:
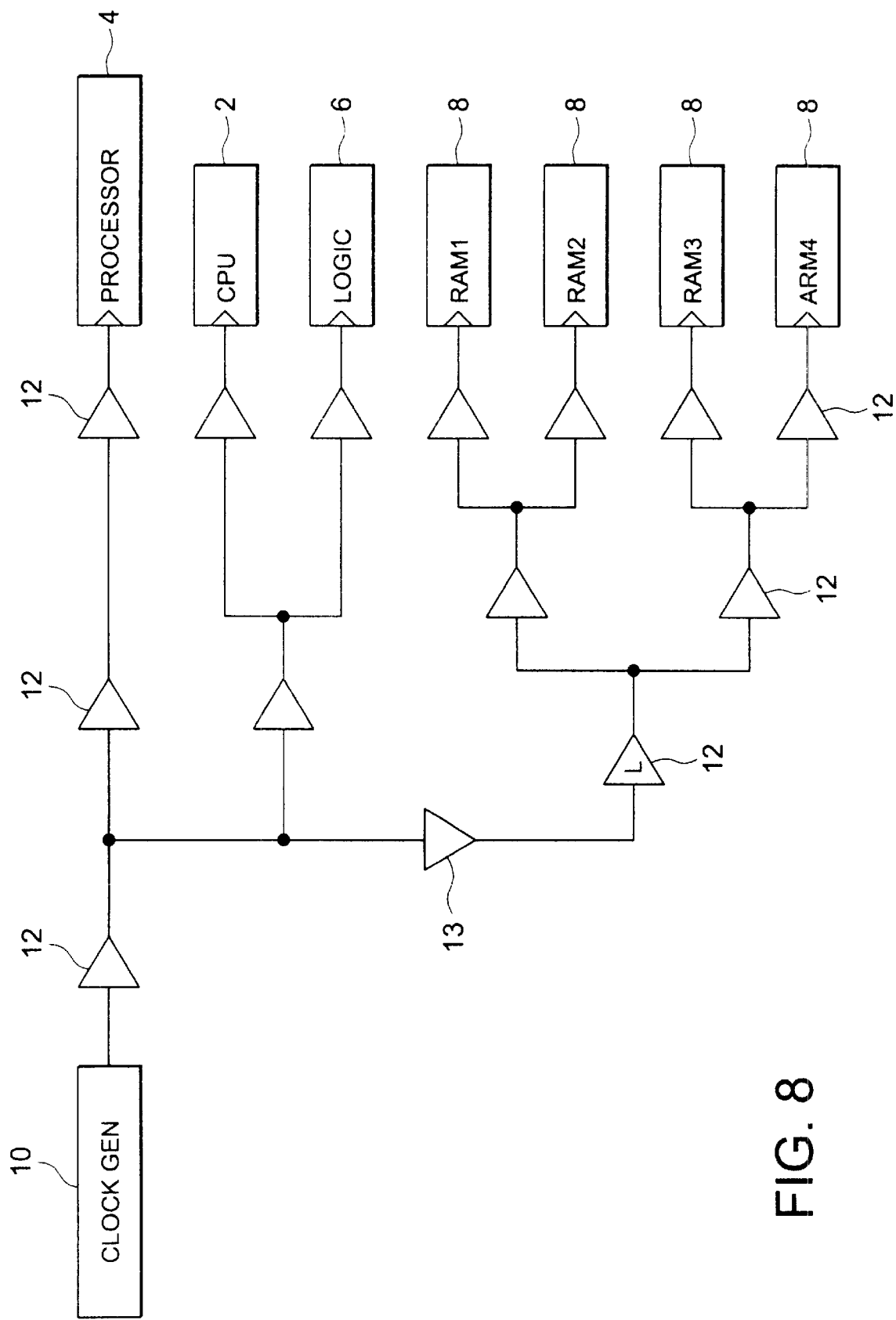

If the RAM set-up timing requirements are still not met, the leaf-cell designations can be moved still further back, as indicated in FIG. 8. In FIG. 8 a new clock distribution cell 13 is added on the RAM clock path, upstream of the newly designated leaf cell L. This process can be repeated as often as necessary, moving the leaf cells on the RAM clock paths further back each time, until a satisfactory set-up time is achieved.

Figure 9:
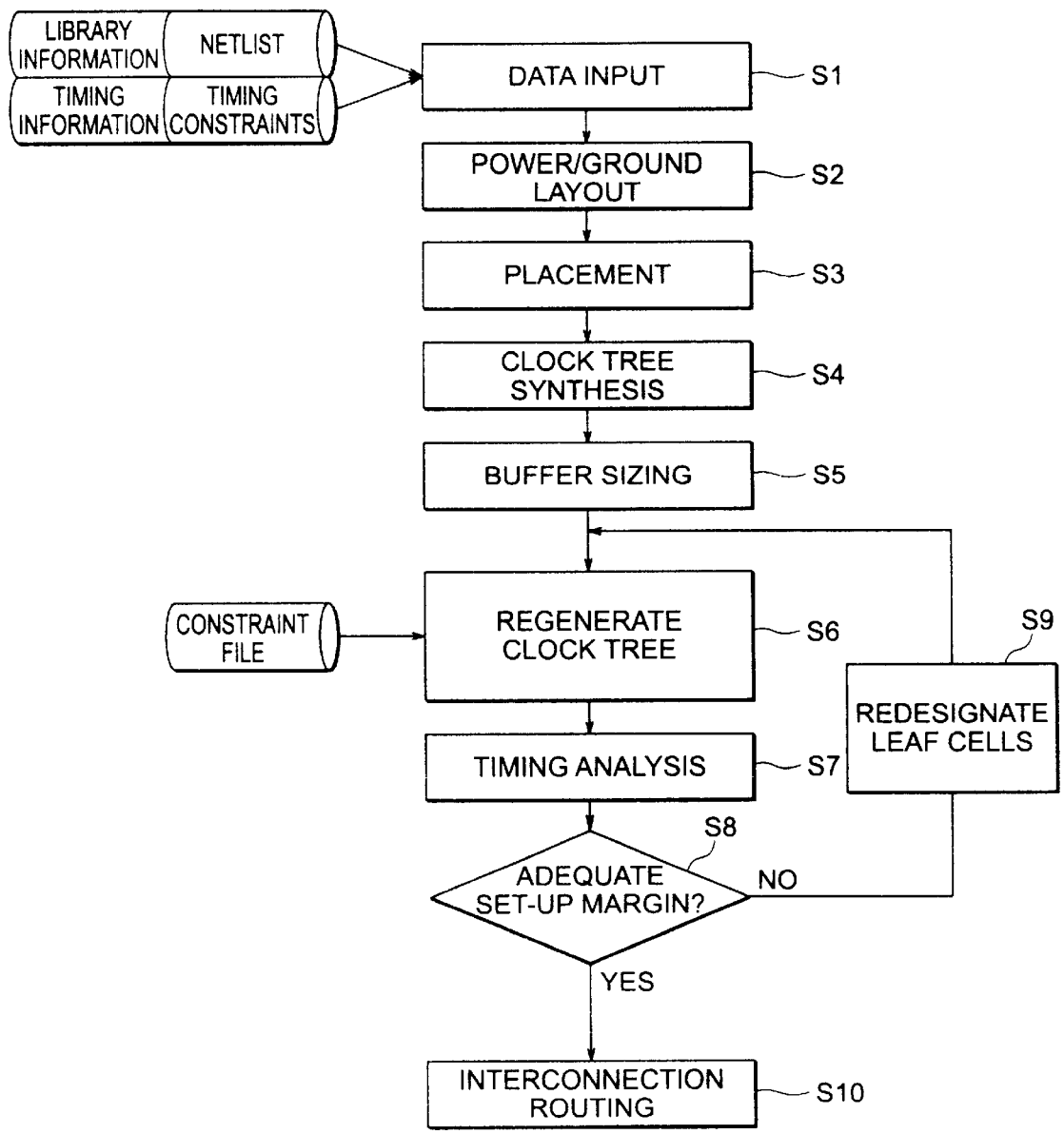
FIG. 9 is a flowchart illustrating the first aspect of the invention.

Referring to FIG. 9, the integrated circuit design process in the first embodiment begins with data input (step S1), including the input of information from cell libraries, input of an HDL netlist, input of timing information, and input of timing constraints. The power-supply and ground lines are then laid out (step S2), and the logic gates, cells, and macrocells required by the HDL description of the integrated circuit are placed in appropriate locations (step S3) by the computer-aided design tools.

Next, the computer-aided design tools automatically synthesize a clock tree (step S4). As described above, the clock tree includes a root cell, leaf cells, and clock distribution cells or buffers 12, each buffer 12 being a buffer amplifier or inverter. The computer-aided design tools attempt to minimize the number of buffers while satisfying a number of constraints, including a constraint on maximum load, a constraint on maximum transition time, constraints on maximum insertion delay and minimum insertion delay, and a constraint on maximum clock skew. Insertion delay refers to the clock propagation delay from the root cell to a leaf cell; skew refers to the clock timing difference between different leaf cells.

When the clock tree has been generated, the dimensions of the transistors in the clock distribution cells 12 are increased to enhance their current-driving capability and eliminate any wiring load violations and other violations for the design as a whole. This process (step S5) is referred to as buffer sizing, or more specifically as buffer up-sizing. Buffer up-sizing also reduces propagation delays and increases the operating speed of the circuit.

Violations of design constraints can also be removed by inserting buffers with high current-driving capability in this step. Step S5 is carried out in several stages. Maximum load violations are corrected by up-sizing of the buffers to increase their driving capability, and by adding buffers, if necessary, to distribute the wiring load. Then a similar process is carried out to correct maximum transition-time violations. The same process is then carried out again to reduce cell propagation delays and increase the operating speed of the circuit, so as to satisfy register set-up timing requirements. Further buffers are then inserted to delay the signals on register data lines, to satisfy hold timing requirements.

If the clock tree generated by the clock-tree synthesis step (S4) and buffer sizing step (S5) fails to satisfy RAM set-up timing requirements, the clock tree is regenerated (step S6), the clock distribution cells or buffers 12 immediately preceding the RAM macrocells now being designated as leaf cells. The resulting clock tree accordingly provides the RAM macrocells with delayed clock signals. Constraint information is supplied from a constraint file during this step (S6).

Following regeneration of the clock tree, a timing analysis is performed (step S7) to determine whether RAM data and address input signals will satisfy set-up and hold timing requirements with respect to RAM clock input.

A decision is then made as to whether there is an adequate set-up margin (step S8). If there is not, the leaf cells are moved farther back from the RAM macrocells (step S9), depending on the delay that needs to be added, and the process returns to step S6 to generate the clock tree again.

Steps S6 to S9 may be repeated any number of times. As the leaf cells in the clock tree are moved farther away from the RAM macrocells, the delay from the leaf cells to the RAM macrocells increases, until an adequate set-up timing margin is achieved. The process then proceeds from step S8 to the final routing of interconnections (step S10).

The above process may fail to converge, either because a RAM hold-time error occurs before the RAM set-up timing requirement is satisfied, or because a set-up timing violation occurs in a register following the RAM macrocells 8 before the RAM set-up timing requirement is satisfied. In either of these cases, the integrated circuit is redesigned with a different architecture, or a different logic design.

Figure 10:
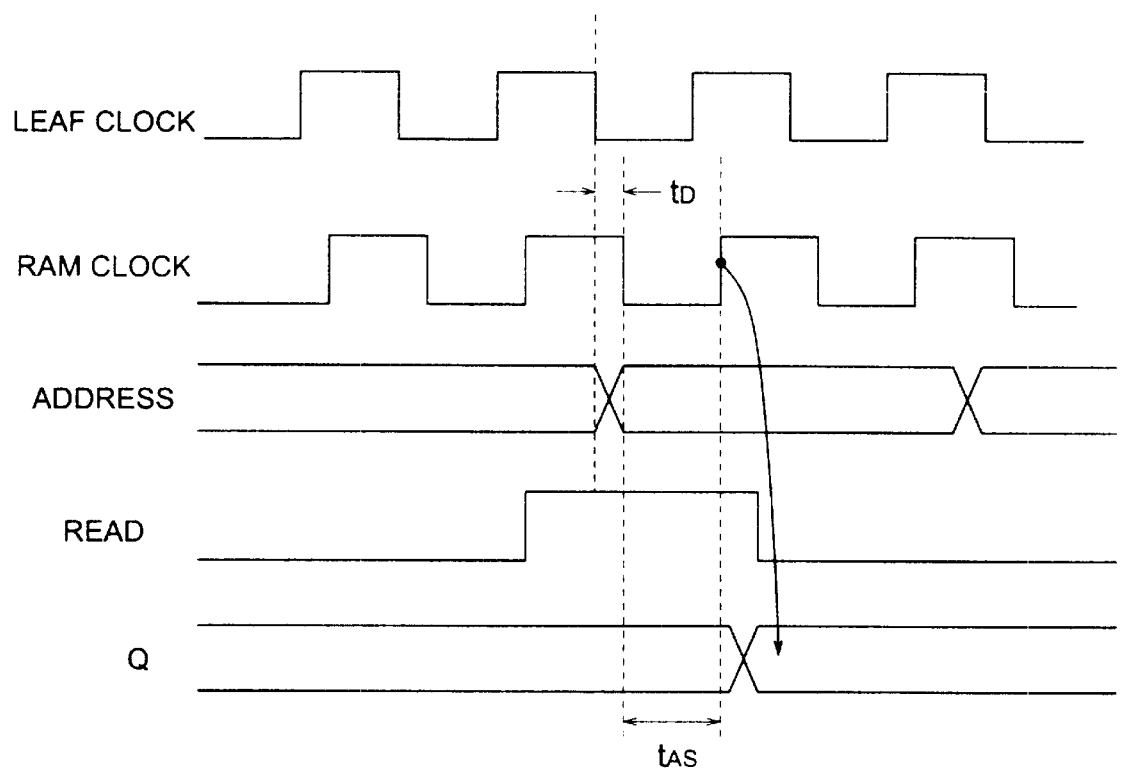
FIG. 10 is a timing diagram illustrating the effect of the invention.

FIG. 10 illustrates the;effect of the first embodiment in RAM read access. The leaf clock signal shown at the top of FIG. 10 is the clock signal supplied to leaf cells in the final clock tree, including leaf cells in the CPU core 2 and buffers designated as leaf cells on the clock paths leading to the RAM macrocells 8. The RAM clock signal is the clock signal actually supplied to the RAM macrocells 8. As shown, the RAM clock signal is delayed by an amount $t_D$ with respect to the leaf clock signal. Since RAM address signals are generated in synchronization with the leaf clock signal, and RAM data (Q) are output in synchronization with the RAM clock signal, the delay between the two clock signals increases the set-up time $t_{AS}$ to, in this example, substantially one-half clock cycle, which is an adequate set-up time.

The first embodiment provides a method of using computer-aided design tools, which attempt to minimize clock skew, to synthesize a clock tree in which the clock signals supplied to RAM macrocells are intentionally delayed to meet RAM set-up timing requirements. The amount of delay can be increased by designating RAM clock distribution cells closer to the clock root cell as leaf nodes. Only the RAM clock signals are delayed, so the clock signals supplied to other parts of the integrated circuit are correctly aligned in timing and do not have to be adjusted manually.

Figure 11:
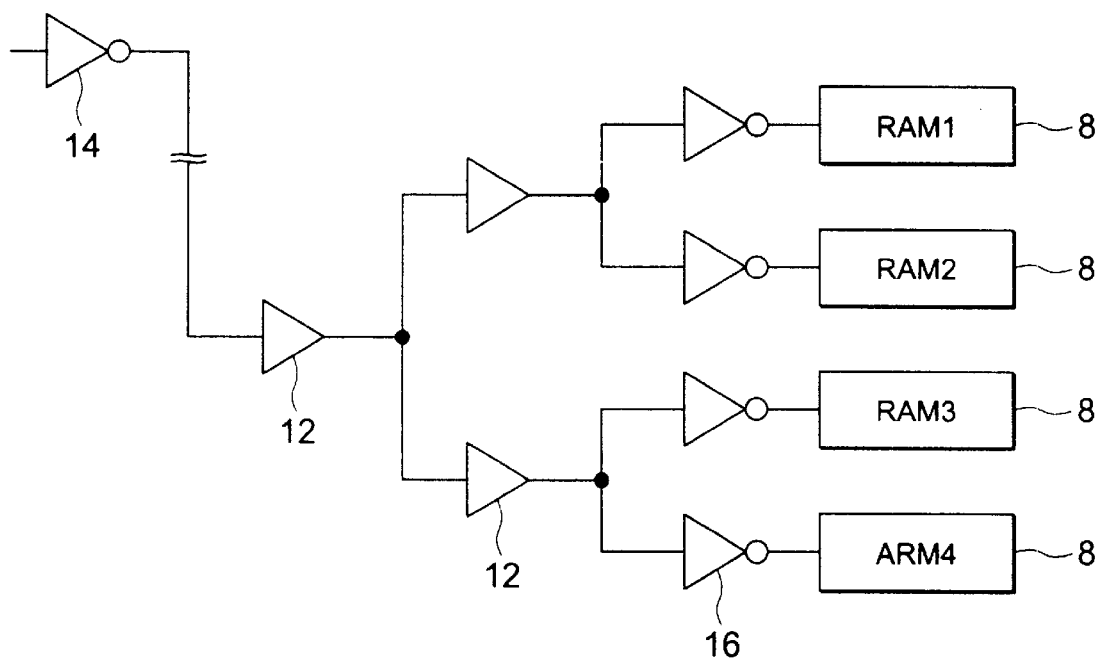
FIG. 11 is a block diagram illustrating a clock tree with inverters.

The second embodiment achieves similar effects by down-sizing one or more of the buffers on the clock distribution path. Referring to FIG. 11, if conventional clock tree generation produces a clock tree in which, for example, the first clock distribution cell 14 and the last clock distribution cells 16 on the RAM clock paths are inverters, the second embodiment may reduce the dimensions of the transistors in the last clock distribution cells 16. If these clock distribution cells 16 were up-sized by a factor of eight during the clock tree generation process, for example, the second embodiment can delay the RAM clock signal by down-sizing the final clock distribution cells 16 by a factor of four, so that their transistors are only twice as large as they were before up-sizing. If necessary, other clock distribution cells 12 on the RAM clock line can be similarly down-sized to produce a desired clock delay.

Figure 12:
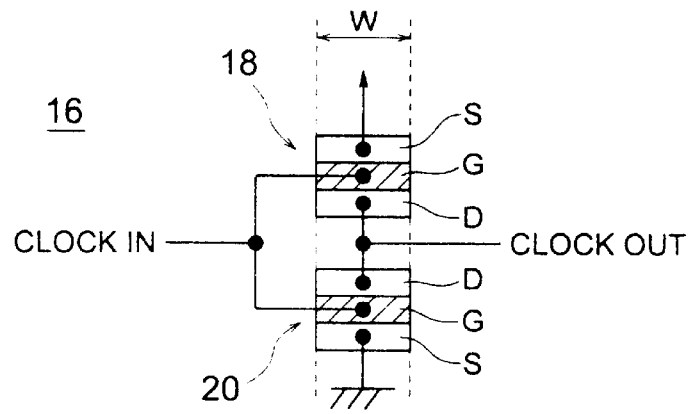
FIGS. 12, 13, and 14 are plan views of one of the inverters in FIG. 11, illustrating three stages in automatic clock tree generation according to the second aspect of the present invention.
Figure 13:
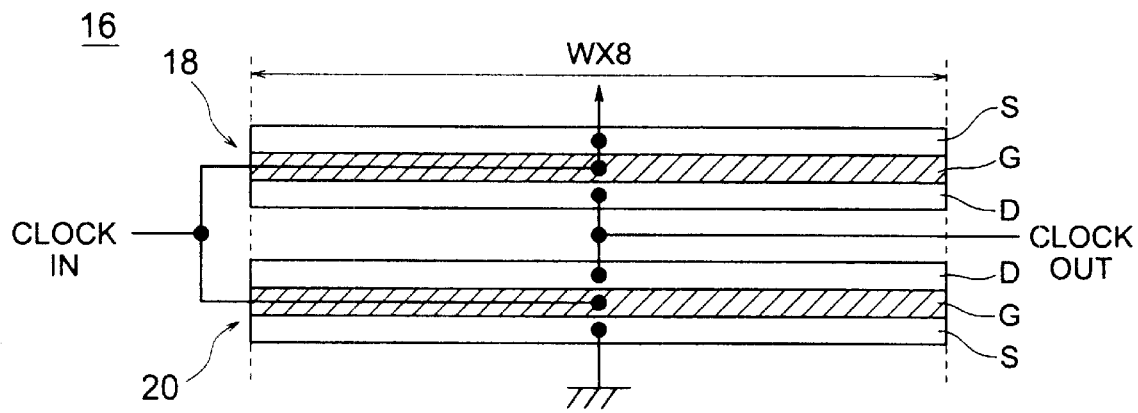
Figure 14:
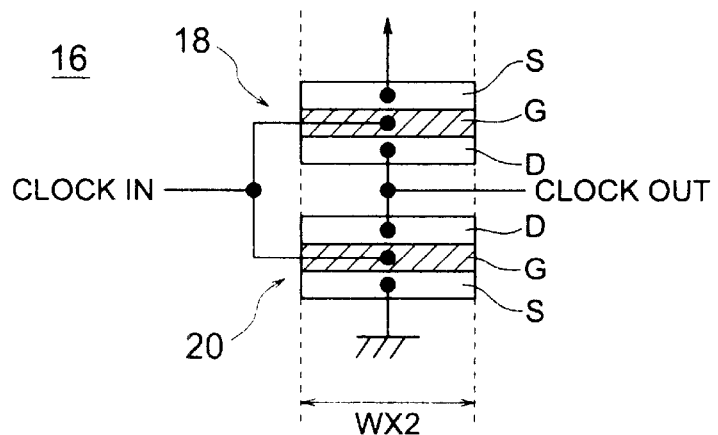

FIG. 12 illustrates hypothetical transistor dimensions in a clock distribution cell 16 before the buffer sizing step in the original clock-tree generation process. This clock distribution cell 16 comprises a p-channel transistor 18 and an n-channel transistor 20, each having a source (S), a gate (G), and a drain (D) with a certain width (W). The buffer sizing step increases the widths of the source, gate, and drain of each transistor 18, 20 by a factor of eight (from W to W×8), as illustrated in FIG. 13, thereby increasing the channel widths of the transistors by a factor of eight and increasing the current-driving capability of the clock distribution cell 16 by a similar factor of eight. The second embodiment then reduces the source, gate, and drain widths by a factor of four (from W×8 to W×2) as illustrated in FIG. 14.

Figure 15:
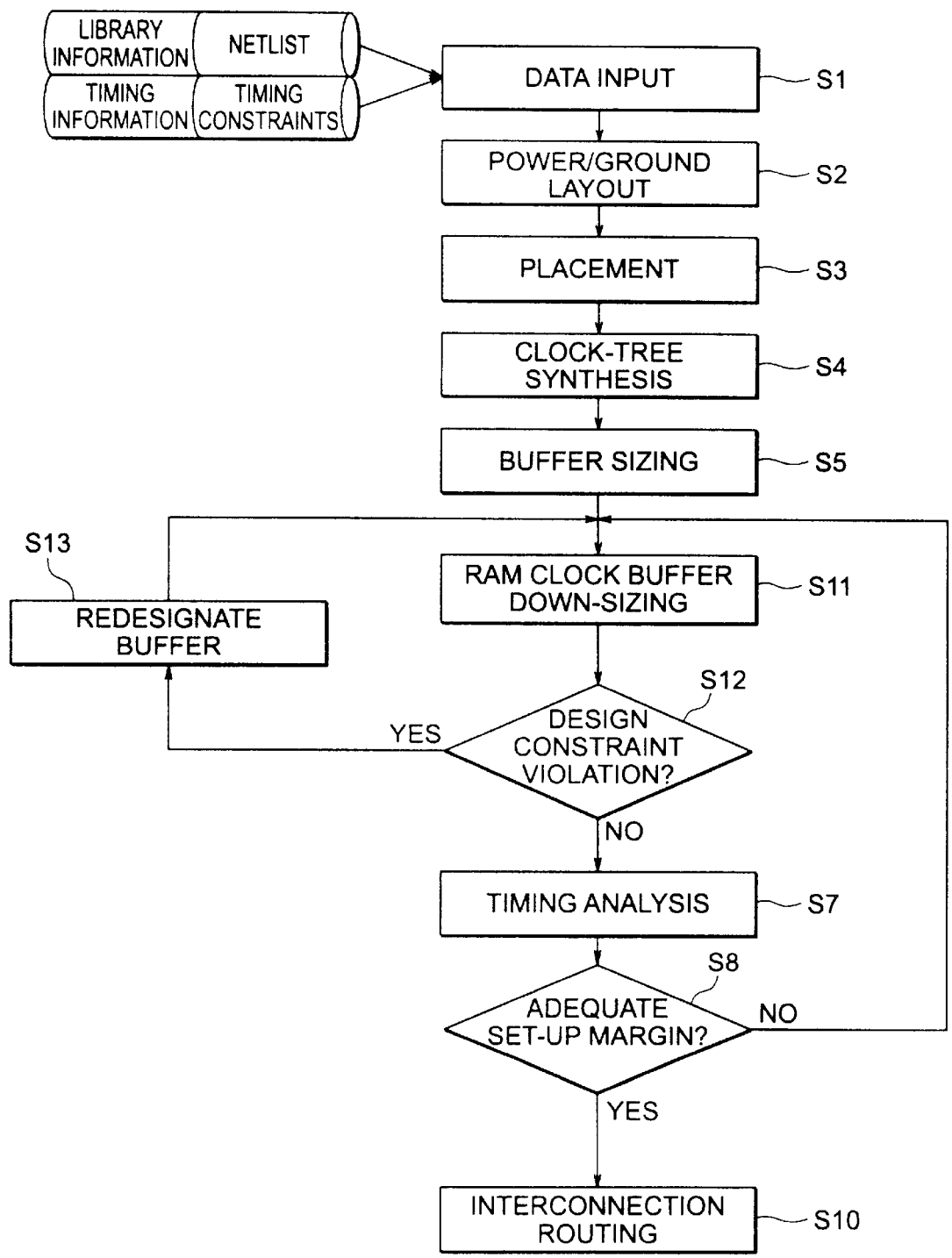
FIG. 15 is a flowchart illustrating the second aspect of the present invention.

Referring to FIG. 15, the design method of the second embodiment begins with the same steps of data input (S1), power-supply and ground wiring layout (S2), placement of cells and logic gates (S3), clock tree synthesis (S4), and buffer sizing (S5) as in the first embodiment. Then one of the clock distribution cells on the RAM clock path is replaced with a clock distribution cell of smaller driving capability; that is, a cell with smaller transistors (step S11). The first time this down-sizing step is performed, the clock distribution cell immediately preceding each RAM macrocell 8 may be down-sized by a predetermined factor or amount. Down-sizing has the effect of delaying the RAM clock signal.

Following the down-sizing step, other design constraints are checked, such as constraints related to wiring load capacitance and signal transition time, and constraints on minimum transistor dimensions (step S12). If this check passes, a timing analysis is performed (step S7) and a decision as to whether RAM set-up timing requirements are satisfied is made (step.S8), as in the first embodiment. If the requirements are satisfied, the process proceeds to final interconnection routing (step S10).

If the RAM set-up timing requirements are not satisfied, the process returns to step S11 for further down-sizing of the same clock distribution cell, if possible. The loop from step S11 to step S8 is repeated until either the RAM set-up timing requirements are satisfied in step S8, or a design constraint is violated in step S12.

When a design constraint is violated in step S12, the last repetition of the down-sizing step (the repetition that violated the constraint) is disregarded, and a different clock distribution cell, such as the closest preceding clock distribution cell, is designated for down-sizing (step S13). The process then returns to step S11 to begin down-sizing the newly designated clock distribution cell. Steps S11, S12, S7, S8, and S13 are repeated until an adequate RAM set-up time is achieved.

The process shown in FIG. 15 may fail to converge. For example, the necessary set-up time may not be achieved even after all clock distribution cells on the RAM clock path have been down-sized as much as possible. Also, as in the first embodiment, a RAM hold-time error may occur before the RAM set-up timing requirement is satisfied, or a set-up timing violation may occur in a register following the RAM before the RAM set-up timing requirement is satisfied. In any of these cases, the integrated circuit is redesigned with a different architecture, or a different logic design.

The second embodiment delays the RAM clock signal by reducing the driving capability of one or more of the clock buffers on the RAM clock path. The length of the delay can be varied by varying the transistor dimensions in the buffer circuits. Only the RAM clock signal is selected; other clock signals retain the timing they were given in conventional clock tree synthesis.

In a variation of the second embodiment, when the design constraint check in step S12 passes, the down-sizing step (S11) is repeated without a timing analysis. The timing analysis in step S7 is performed only when the design constraint check in step S12 fails; that is, when the currently designated clock distribution cell has already been down-sized by the maximum possible amount. If the RAM set-up timing requirements are not satisfied in step S8, the process branches to step S13 to designate another clock distribution cell, then returns to step S11 to begin down-sizing the designated cell. This variation has the advantage of requiring less timing analysis.

Both the first and second embodiments delay the RAM clock signal by starting from a conventional balanced clock tree generated by computer-aided design tools, having minimal clock skew, and then varying the buffer elements on the RAM clock paths in the clock tree. The first embodiment does so by changing the designations of the leaf cells on the RAM clock paths. The second embodiment changes the driving capability of one or more buffer circuits on the RAM clock path. The invention can also be practiced, however, by replacing one or more of the buffers on the RAM clock line with a delay element.

Those skilled in the art will recognize that further variations are possible within the scope claimed below.

What is claimed is:

1. A method of designing a semiconductor integrated circuit including at least one data-processing unit and at least one random-access memory macrocell, the random-access memory macrocell having a set-up timing requirement, the method using computer-aided design tools and a hardware description language and comprising the steps of:

automatically generating a clock tree, by use of the computer-aided design tools, the clock tree including a first clock path having a root cell at which a clock signal is generated, a leaf cell disposed in the random-access memory macrocell, and at least one buffer disposed between the root cell and the leaf cell, and a second clock path beginning at said root cell and terminating in the at least one data-processing unit; and modifying the clock tree, by use of the computer-aided design tools, thereby increasing a clock propagation delay on said first clock path relative to said second clock path, so as to satisfy the set-up timing requirement.

2. The method of claim 1, wherein said step of modifying further comprises the steps of:

designating said buffer as a leaf cell; and
   automatically regenerating the clock tree, by use of the computer-aided design tools.

3. The method of claim 1, wherein said step of modifying includes down-sizing said buffer.

4. The method of claim 1, wherein said step of modifying includes replacing said buffer with a delay element.

5. A method of designing a semiconductor integrated circuit including at least one data-processing unit and at least one random-access memory macrocell, the random-access memory macrocell having a set-up timing requirement, the method using computer-aided design tools and a hardware description language and comprising the steps of:

designating a root cell at which a clock signal is generated;

designating a leaf cell in the random-access memory macrocell;

automatically generating a first clock tree, by use of the computer-aided design tools, the first clock tree including a first clock path beginning at said root cell and terminating at said leaf cell and a second clock path beginning at said root cell and terminating in the at least one data-processing unit, the first clock path including a first buffer disposed between said leaf cell and said root cell;

designating the first buffer as a leaf cell in place of the leaf cell designated in the random-access memory macrocell; and regenerating the first clock tree, by use of the computer-aided design tools, thereby obtaining a second clock tree that supplies a clock signal to the first buffer, the clock signal then being supplied to the random-access memory macrocell with a first delay by a remaining part of the first clock tree between the first buffer and the random-access memory macrocell.

6. The method of claim 5, wherein the first buffer is coupled directly to the random-access memory macrocell.

7. The method of claim 5, further comprising the steps of:

performing a timing analysis to determine whether the second clock tree satisfies the set-up timing requirement; and if the set-up timing requirement is not satisfied, and if the second clock tree has a second buffer disposed between the first buffer and the root cell, designating the second buffer as a leaf cell in place of the first buffer, and regenerating the second clock tree by use of the computer-aided design tools, thereby obtaining a third clock tree that supplies a clock signal to the random-access memory macrocell with a second delay greater than the first delay.

8. The method of claim 7, wherein the second buffer is coupled directly to the first buffer.

9. A method of designing a semiconductor integrated circuit including at least one random-access memory macrocell, using computer-aided design tools and a hardware description language, comprising the steps of:

designating a root cell at which a clock signal is generated;

designating a leaf cell in the random-access memory macrocell;

automatically generating a first clock tree, by use of the computer-aided design tools, the first clock tree including a clock path beginning at said root cell and terminating at said leaf cell, the clock path including a first buffer disposed between said leaf cell and said root cell; and down-sizing the first buffer by decreasing transistor dimensions in the first buffer, thereby reducing a current-driving capability of the first buffer and obtaining a second clock tree that supplies a clock signal to the random-access memory macrocell with a first delay;

checking for design constraint violations after said step of down-sizing;

performing a timing analysis to determine whether the second clock tree provides an adequate set-up timing margin for the random-access memory macrocell, provided no design constraints are violated in said step of checking;

further down-sizing the first buffer if the set-up timing margin is inadequate; and if a design constraint is violated in said step of checking, and if the second clock tree has a second buffer disposed between the leaf cell and the root cell, down-sizing the second buffer by decreasing transistor dimensions in the second buffer, instead of down-sizing the first buffer.

10. The method of claim 11, wherein the first buffer is coupled directly to the random-access memory macrocell.

11. A method of designing a semiconductor integrated circuit including at least one random-access memory macrocell, using computer-aided design tools and a hardware description language, comprising the steps of:

designating a root cell at which a clock signal is generated;

designating a leaf cell in the random-access memory macrocell;

automatically generating a first clock tree, by use of the computer-aided design tools, the first clock tree including a clock path beginning at said root cell and terminating at said leaf cell, the clock path including a first buffer disposed between said leaf cell and said root cell; and down-sizing the first buffer by decreasing transistor dimensions in the first buffer, thereby reducing a current-driving capability of the first buffer and obtaining a second clock tree that supplies a clock signal to the random-access memory macrocell with a first delay;

checking for design constraint violations after said step of down-sizing;

repeating said step of down-sizing until a design constraint violation is found in said step of checking;

disregarding the repetition of said step of down-sizing that caused the design constraint violation;

performing a timing analysis to determine whether the second clock tree provides an adequate set-up timing margin for the random-access memory macrocell, after said step of disregarding; and if the set-up timing margin is inadequate, and if the second clock tree has a second buffer disposed between the leaf cell and the root cell, down-sizing the second buffer by decreasing transistor dimensions in the second buffer, thereby obtaining a third clock tree that supplies a clock signal to the random-access memory macrocell with a second delay greater than the first delay.

12. The method of claim 11, wherein the first buffer is coupled directly to the random-access memory macrocell.

* * * * *